United States Patent
Hiroishi

(10) Patent No.: US 11,521,822 B2
(45) Date of Patent: Dec. 6, 2022

(54) ION GUN AND VACUUM PROCESSING APPARATUS

(71) Applicant: CANON ANELVA CORPORATION, Kawasaki (JP)

(72) Inventor: Tsutomu Hiroishi, Kawasaki (JP)

(73) Assignee: CANON ANELVA CORPORATION, Kawasaki (JP)

( * ) Notice: Subject to any disclaimer, the term of this patent is extended or adjusted under 35 U.S.C. 154(b) by 0 days.

(21) Appl. No.: 17/828,312

(22) Filed: May 31, 2022

(65) Prior Publication Data
US 2022/0301807 A1 Sep. 22, 2022

Related U.S. Application Data

(63) Continuation of application No. PCT/JP2020/028362, filed on Jul. 22, 2020.

(51) Int. Cl.
*H01J 37/08* (2006.01)
*H01J 37/305* (2006.01)

(52) U.S. Cl.
CPC .......... *H01J 37/08* (2013.01); *H01J 37/3053* (2013.01); *H01J 2237/022* (2013.01); *H01J 2237/152* (2013.01)

(58) Field of Classification Search
CPC .. H01J 37/08; H01J 37/3053; H01J 2237/022; H01J 2237/152
See application file for complete search history.

(56) References Cited

U.S. PATENT DOCUMENTS 5,763,989 A  6/1998  Kaufman
6,593,152 B2  7/2003  Nakasuji et al.
6,855,929 B2  2/2005  Kimba et al.
7,049,585 B2  5/2006  Nakasuji et al.
7,095,022 B2  8/2006  Nakasuji et al.
7,109,483 B2  9/2006  Nakasuji et al.
7,109,484 B2  9/2006  Nakasuji et al.
7,129,485 B2  10/2006  Nakasuji et al.
7,135,676 B2  11/2006  Nakasuji et al.
7,223,973 B2  5/2007  Kimba et al.
7,241,993 B2  7/2007  Nakasuji et al.
(Continued)

FOREIGN PATENT DOCUMENTS

CN  109065429 A  12/2018
JP  2008-053116 A  3/2008
(Continued)

OTHER PUBLICATIONS

Office Action in Taiwanese Application No. 110123751 (dated Mar. 2022).
(Continued)

*Primary Examiner* — Nicole M Ippolito
*Assistant Examiner* — Hanway Chang
(74) *Attorney, Agent, or Firm* — Venable LLP

(57) ABSTRACT

An ion gun including an anode, a cathode opposed to the anode and having a first portion and a second portion, and a magnet configured to form a magnetic field space between the first portion and the second portion. An annular gap including a linear portion and a curved portion is provided between the first portion and the second portion of the cathode. The magnet is configured to form, between the first portion and the second portion of the curved portion, a magnetic field line having a bottom inside a cross-sectional centerline of the gap.

20 Claims, 10 Drawing Sheets

(56) References Cited

U.S. PATENT DOCUMENTS

| | | | |
|---|---|---|---|
| 7,244,932 B2 | 7/2007 | Nakasuji et al. |
| 7,247,848 B2 | 7/2007 | Nakasuji et al. |
| 7,297,949 B2 | 11/2007 | Nakasuji et al. |
| 7,408,175 B2 | 8/2008 | Kimba et al. |
| 7,411,191 B2 | 8/2008 | Nakasuji et al. |
| 7,417,236 B2 | 8/2008 | Nakasuji et al. |
| 7,423,267 B2 | 9/2008 | Nakasuji et al. |
| 7,439,502 B2 | 10/2008 | Nakasuji et al. |
| 7,601,972 B2 | 10/2009 | Nakasuji et al. |
| 7,745,784 B2 | 6/2010 | Nakasuji et al. |
| 7,829,871 B2 | 11/2010 | Nakasuji et al. |
| 7,888,642 B2 | 2/2011 | Nakasuji et al. |
| 7,928,378 B2 | 4/2011 | Nakasuji et al. |
| 8,053,726 B2 | 11/2011 | Nakasuji et al. |
| 8,368,031 B2 | 2/2013 | Nakasuji et al. |
| 8,803,103 B2 | 8/2014 | Nakasuji et al. |
| 8,822,919 B2 | 9/2014 | Nakasuji et al. |
| 9,368,314 B2 | 6/2016 | Nakasuji et al. |
| 2004/0016640 A1 | 1/2004 | Veerasamy et al. |
| 2005/0247885 A1 | 11/2005 | Madocks |
| 2007/0045536 A1 | 3/2007 | Nakasuji et al. |
| 2008/0121804 A1 | 5/2008 | Nakasuji et al. |
| 2008/0173815 A1 | 7/2008 | Nakasuji et al. |
| 2012/0187843 A1 | 7/2012 | Madocks |
| 2014/0367570 A1 | 12/2014 | Kimba et al. |

FOREIGN PATENT DOCUMENTS

| | | |
|---|---|---|
| TW | 539845 B | 1/2003 |
| WO | 2019/182111 A1 | 9/2019 |
| WO | 2022/018840 A1 | 1/2022 |

OTHER PUBLICATIONS

International Search Report with Written Opinion in International Application No. PCT/JP2020/028362 (dated Oct. 2020).

US 11,521,822 B2

ION GUN AND VACUUM PROCESSING APPARATUS

CROSS-REFERENCE TO RELATED APPLICATIONS

This application is a Continuation of International Patent Application No. PCT/JP2020/028362, filed Jul. 22, 2020, which is hereby incorporated by reference herein in its entirety.

BACKGROUND OF THE INVENTION

Field of the Invention

The present invention relates to an ion gun and a vacuum processing apparatus.

Description of the Related Art

An ion gun is an apparatus for ejecting generated ions as an ion beam, and is used in a vacuum processing apparatus or the like used for manufacturing a semiconductor device or the like. Among them, a type of an ion gun called a closed drift ion source has an ejection port of an ion beam that literally forms a closed loop and is used in various fields by taking advantage of the feature that an area of the ion gun can be easily increased.

While the closed drift type ion gun has an advantage that plasma generation and ion acceleration can be performed simultaneously, due to its structure, it is inevitable that some accelerated ions collide with a magnetic pole constituting the ejection port. Therefore, the magnetic pole is eroded over time, the discharge stability gradually decreases, and finally the discharge cannot be maintained. In addition to the erosion of the magnetic pole, this also causes problems such as contamination of a processed object due to the eroded magnetic pole material, heat generation of the magnetic pole, and reduction in etching rate due to beam loss.

As a method for solving such a problem, U.S. Patent Application Publication No. 2005/0247885 discloses an ion gun in which a mirror ratio in the vicinity of an ejection port is increased. Further, U.S. Patent Application Publication No. 2004/0016640 discloses an ion gun in which magnetic poles are coated with a member having high sputtering resistance.

As a closed drift type ion gun, it is known that there is an ion gun having an annular ejection port in which a linear portion and a curved portion are combined in shape. However, the present inventors find it clear for the first time that, in such an ion gun, if the linear portion and the curved portion are designed in the same manner, the amount of ions colliding with the magnetic pole is small in the linear portion but very large in the curved portion. In U.S. Patent Application Publication No. 2005/0247885 and U.S. Patent Application Publication No. 2004/0016640, no special consideration has been made on the shape of the ejection port.

SUMMARY OF THE INVENTION

An object of the present invention is to provide an ion gun capable of improving the ejection efficiency and uniformity of an ion beam and stably operating over a long period of time, and a vacuum processing apparatus using it.

According to an aspect of the present disclosure, there is provided an ion gun including an anode, a cathode opposed to the anode and having a first portion and a second portion, and a magnet configured to form a magnetic field space between the first portion and the second portion. An annular gap including a linear portion and a curved portion is provided between the first portion and the second portion of the cathode. The magnet is configured to form, between the first portion and the second portion of the curved portion, a magnetic field line having a bottom inside a cross-sectional centerline of the gap.

According to another aspect of the present disclosure, there is provided an ion gun including an anode, a cathode opposed to the anode and having a first portion and a second portion, and a magnet configured to form a magnetic field space between the first portion and the second portion. An annular gap including a linear portion and a curved portion is provided between the first portion and the second portion of the cathode. The first portion is arranged inside with respect to the gap and the second portion is arranged outside with respect to the gap. The magnet is configured to form, in a space between the first portion and the second portion and the anode, a magnetic field line in a direction from the second portion to the first portion. In the curved portion, a magnetic field vector at a point where the magnetic field line and the cross-sectional centerline of the gap intersect with each other is inclined to a side of the first portion and the second portion, with respect to a plane orthogonal to the cross-sectional centerline, at a first angle smaller than 1.5 degrees and larger than 0 degrees to a side of the anode.

According to yet another aspect of the present disclosure, there is provided an ion beam adjusting method adjusting an ion beam ejected from a gap in an ion gun including an anode, a cathode opposed to the anode and having a first portion and a second portion, and a magnet configured to form a magnetic field space between the first portion and the second portion wherein the gap is an annular gap including a linear portion and a curved portion and provided between the first portion and the second portion of the cathode. The method including adjusting a center position of an ion beam ejected from the gap by shifting a position of a bottom of a magnetic field line formed between the first portion and the second portion of the curved portion toward inside of a cross-sectional centerline of the gap.

According to yet another aspect of the present disclosure, there is provided an ion beam adjusting method adjusting an ion beam ejected from a gap in an ion gun including an anode, a cathode opposed to the anode and having a first portion and a second portion, and a magnet configured to form a magnetic field space between the first portion and the second portion wherein the gap is an annular gap including a linear portion and a curved portion and provided between the first portion and the second portion of the cathode, wherein the first portion is arranged inside with respect to the gap and the second portion is arranged outside with respect to the gap, and wherein the magnet is configured to form, in a space between the first portion and the second portion and the anode, a magnetic field line in a direction from the second portion to the first portion. The method including adjusting a center position of an ion beam ejected from the gap by inclining in the curved portion, a magnetic field vector at a point where the magnetic field line and the cross-sectional centerline of the gap intersect with each other toward the anode with respect to a plane orthogonal to the cross-sectional centerline.

According to the present invention, the ejection efficiency and uniformity of the ion beam can be improved. In addition, it is possible to suppress collision of the ion beam with the magnetic pole, and realize excellent effects such as reduction in temporal change, improvement in maintenance cycle, and reduction in running cost.

Further features of the present invention will become apparent from the following description of exemplary embodiments with reference to the attached drawings.

DESCRIPTION OF THE EMBODIMENTS

First Embodiment

Figure 1:
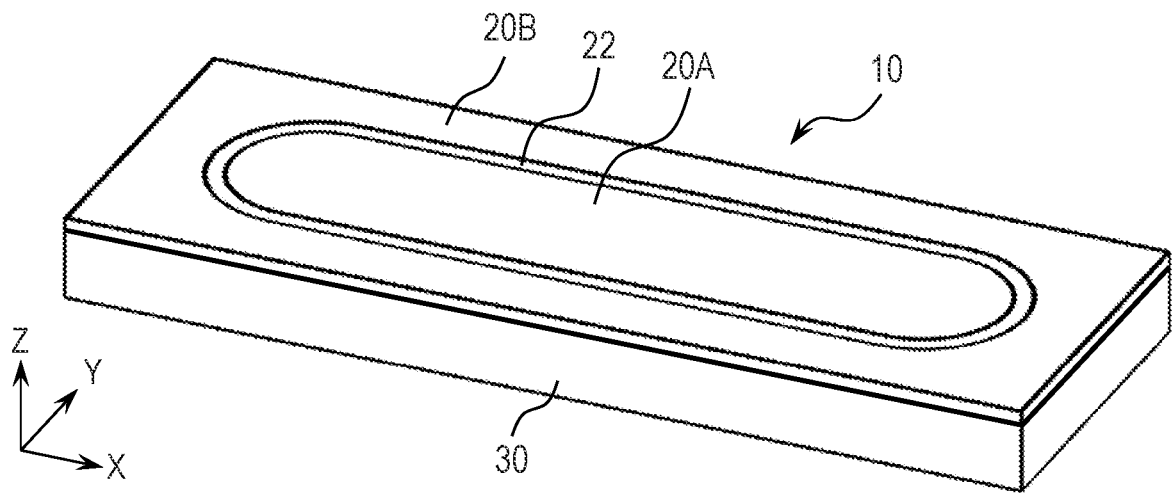
FIG. 1 is a perspective view illustrating a structure of an ion gun according to a first embodiment of the present invention.
Figure 2:
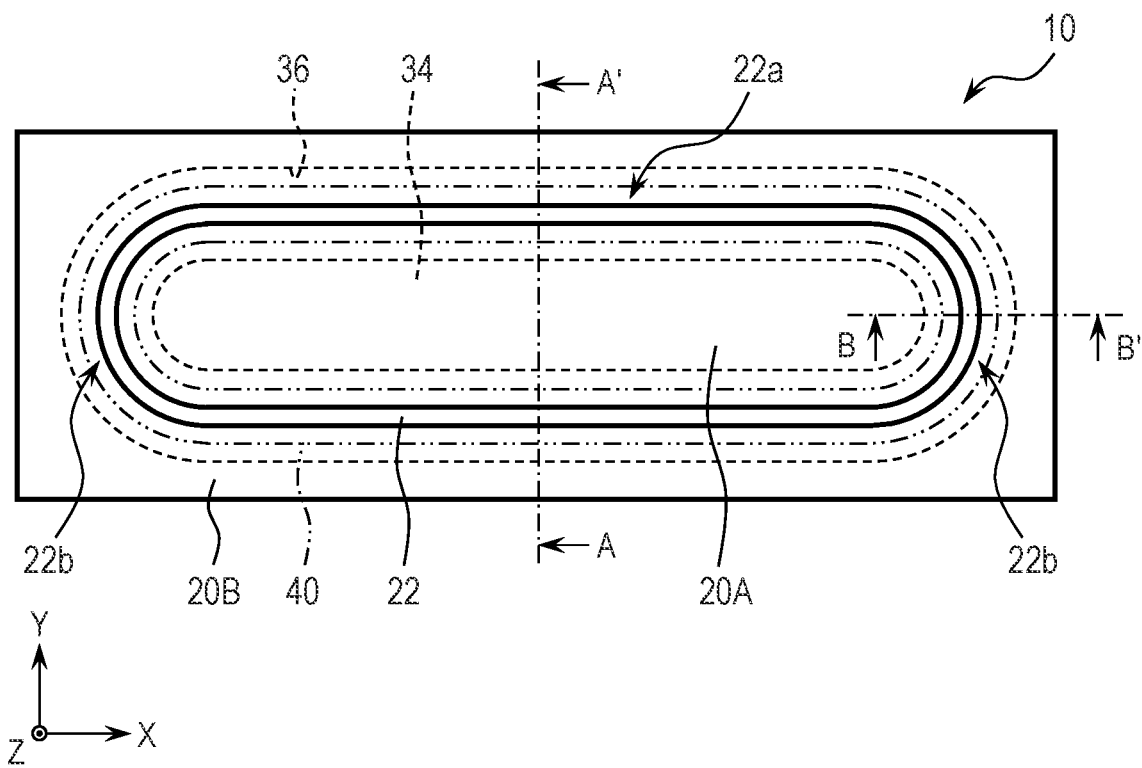
FIG. 2 is a plan view illustrating the structure of the ion gun according to the first embodiment of the present invention.
Figure 3A:
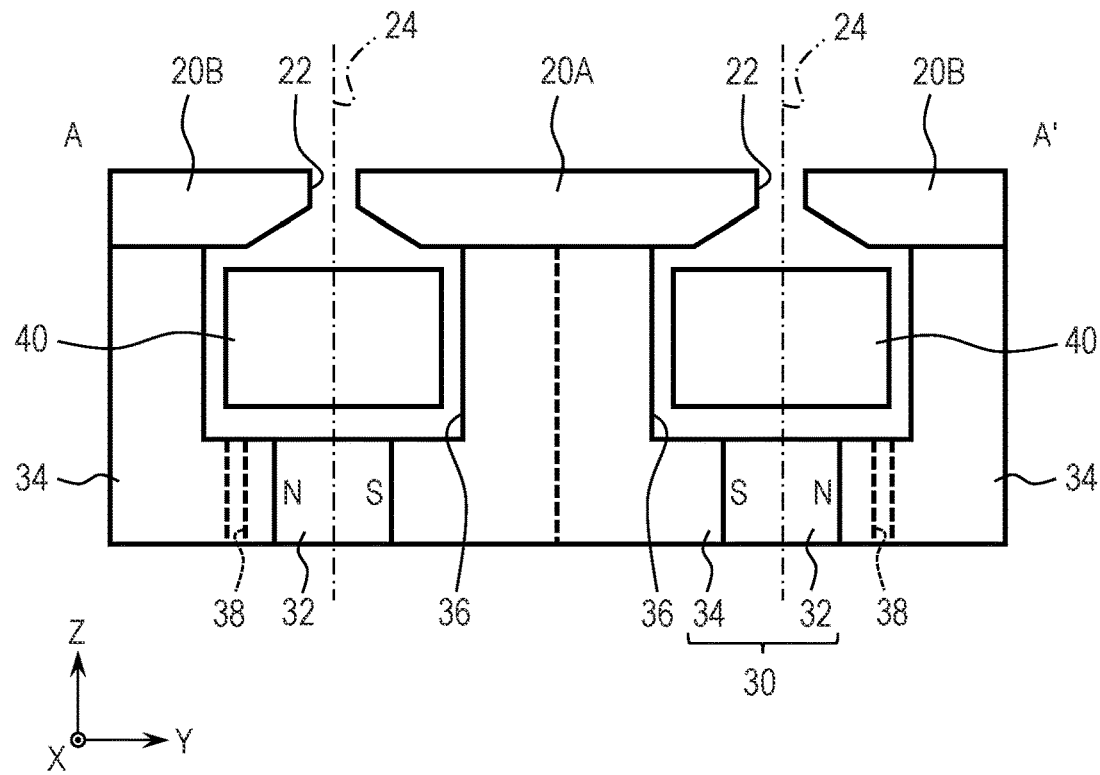
FIG. 3A is a schematic cross-sectional view illustrating the structure of the ion gun according to the first embodiment of the present invention (Part 1).
Figure 3B:
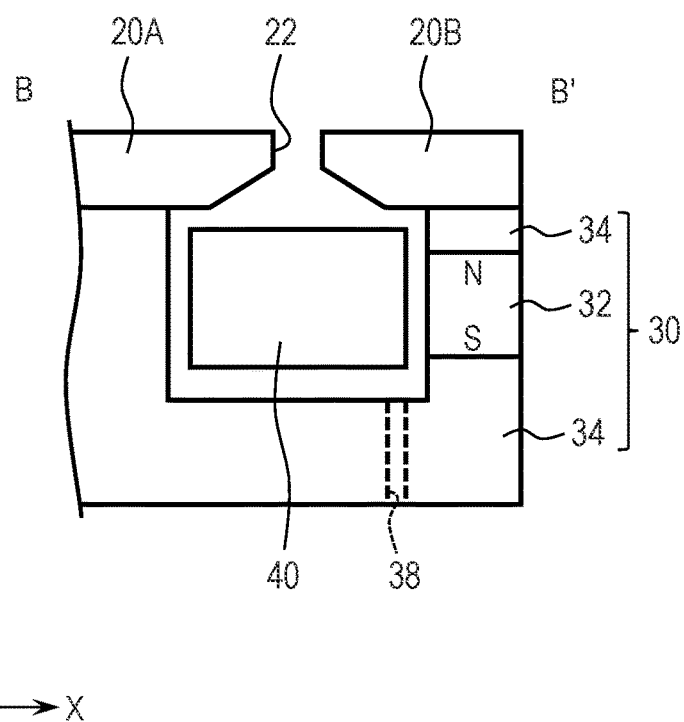
FIG. 3B is a schematic cross-sectional view illustrating the structure of the ion gun according to the first embodiment of the present invention (Part 2).

A structure of an ion gun according to a first embodiment of the present invention will be described with reference to FIGS. 1 to 3B. FIG. 1 is a perspective view illustrating a structure of an ion gun according to the present embodiment. FIG. 2 is a plan view illustrating the structure of the ion gun according to the present embodiment. FIGS. 3A and 3B are schematic cross-sectional views illustrating the structure of the ion gun according to the present embodiment. FIG. 3A is a cross-sectional view taken along line A-A' of FIG. 2, and FIG. 3B is a cross-sectional view taken along line B-B' of FIG. 2.

As illustrated in FIGS. 1 to 3B, the ion gun 10 according to the present embodiment includes magnetic pole plates 20A and 20B, a magnet 32, a yoke 34, and an anode 40, and has a substantially rectangular parallelepiped appearance. As illustrated in FIG. 1, an ejection port 22 for ejecting an ion beam is provided in one main surface of the ion gun 10.

The magnetic pole plate 20A and the magnetic pole plate 20B are tabular bodies made of a high permeability magnetic material having conductivity. The magnetic pole plate 20B is an annular tabular body having an opening corresponding to the outer peripheral shape of the magnetic pole plate 20A. The magnetic pole plate 20A is arranged inside the opening of the magnetic pole plate 20B so as to ensure a predetermined gap between the magnetic pole plate 20A and the magnetic pole plate 20B. The magnetic pole plate 20A and the magnetic pole plate 20B may function as magnetic poles that form a magnetic field space by arranging the magnetic pole plate 20A and the magnetic pole plate 20B with a predetermined gap therebetween. The magnetic pole plate 20A and the magnetic pole plate 20B also function as a cathode opposed to the anode 40. The magnetic pole plate 20A constitutes a first portion of the cathode, and the magnetic pole plate 20B constitutes a second portion of the cathode.

The gap between the magnetic pole plate 20A and the magnetic pole plate 20B forms an annular opening along the outer circumference of the magnetic pole plate 20A and the inner circumference of the magnetic pole plate 20B. The annular opening formed in this manner constitutes the ejection port 22 of the ion beam. For example, as illustrated in FIGS. 1 and 2, the ejection port 22 may include a linear portion 22a and a semicircular curved portion 22b. The ejection port 22 is preferably annular in order to maintain discharge, but the shape of the ejection port 22 is not particularly limited. For example, an arbitrary shape such as a part of a perfect circular shape or a part of an elliptical shape can be applied to the curved portion 22b. The curvature of the curved shape may be constant or may be inconstant.

When viewed from the center of the ejection port 22 in a plan view, as illustrated in FIG. 2, the magnetic pole plate 20A is positioned inside the annular ejection port 22, and the magnetic pole plate 20B is positioned outside the annular ejection port 22. In this specification, the expression "inside" of the ejection port 22 indicates the side of the magnetic pole plate 20A with respect to the ejection port 22, and the expression "outside" of the ejection port 22 indicates the side of the magnetic pole plate 20B with respect to the ejection port 22.

The magnetic pole plate 20A and the magnetic pole plate 20B are not particularly limited as long as they are high permeability magnetic materials having conductivity, and may be composed of, for example, ferromagnetic stainless steel such as SUS430, SmCo alloy, NdFe alloy, or the like.

As illustrated in FIGS. 2 and 3A, the magnet 32 and the yoke 34 constitute a structure 30 having an annular recessed portion 36. The magnetic pole plate 20A and the magnetic pole plate 20B are bonded onto the surface of the structure 30 on which the recessed portion 36 is provided so that the ejection port 22 is positioned thereabove along the recessed portion 36. The yoke 34 is magnetically coupled to the magnet 32 and the magnetic pole plates 20A and 20B, and functions as a magnetic conductor for guiding magnetic flux generated from the magnet 32 to the magnetic pole plates 20A and 20B. The magnet 32 and the yoke 34 are arranged such that a recessed portion 36 is positioned inside a magnetic circuit (magnetic path) formed by the magnetic pole plates 20A and 20B, the magnet 32 and the yoke 34. The magnet 32 forms a magnetic field space between the magnetic pole plate 20A and the magnetic pole plate 20B via the yoke 34. The yoke 34 and the magnet 32 may be electrically connected to the magnetic pole plates 20A and 20B.

The yoke 34 is not particularly limited as long as it is a high permeability magnetic material having conductivity, and may be composed of, for example, ferromagnetic stainless steel such as SUS 430, SmCo alloy, NdFe alloy, or the like. The magnet 32 may be a permanent magnet or an electromagnet. The maximum magnetic flux density in the magnetic field formed between the magnetic pole plate 20A and the magnetic pole plate 20B by the magnet 32 is preferably about 1000 [Gauss].

The yoke 34 is provided with a gas inlet port 38 communicating with the recessed portion 36 from the outside of the structure 30. Although FIGS. 3A and 3B illustrate a plurality of gas inlet ports 38 provided at the bottom of the structure 30, the number and arrangement of the gas inlet ports 38 are not particularly limited.

As illustrated in FIG. 3A, the magnet 32 is positioned on the cross-sectional centerline 24 of the ejection port 22 in the linear portion 22a of the ejection port 22. In other words, the distance between the magnet 32 and the magnetic pole plate 20B is substantially equal to the distance between the magnet 32 and the magnetic pole plate 20A. Alternatively, the length of the magnetic path between the magnet 32 and the magnetic pole plate 20B is substantially equal to the length of the magnetic path between the magnet 32 and the magnetic pole plate 20A. In this specification, the cross-sectional centerline 24 of the ejection port 22 refers to a straight line parallel to the ejection direction (Z direction) of the ion beam passing through the center of the ejection port 22 in the width direction.

As illustrated in FIG. 3B, the magnet 32 is positioned outside the cross-sectional centerline 24 of the ejection port 22 in the curved portion 22b of the ejection port 22. In other words, the distance between the magnet 32 and the magnetic pole plate 20B is shorter than the distance between the magnet 32 and the magnetic pole plate 20A. Alternatively, the length of the magnetic path between the magnet 32 and the magnetic pole plate 20B is shorter than the length of the magnetic path between the magnet 32 and the magnetic pole plate 20A.

The anode 40 is an annular structure corresponding to the shape of the recessed portion 36, and is accommodated in the recessed portion 36 away from the magnetic pole plate 20A, the magnetic pole plate 20B, the magnet 32, and the yoke 34. The anode 40 is opposed to the magnetic pole plates 20A and 20B as cathodes, and functions as an acceleration electrode that accelerates ions in plasma generated in the space between the magnetic pole plates 20A and 20B and the anode 40 together with the magnetic pole plates 20A and 20B. The anode 40 is not particularly limited, but may be fixed to the structure 30 by, for example, a spacer made of an insulating material (not illustrated). The anode 40 may be electrically conductive and does not need to be magnetically considered, and may be composed of, for example, non-magnetic stainless steel.

Figure 4:
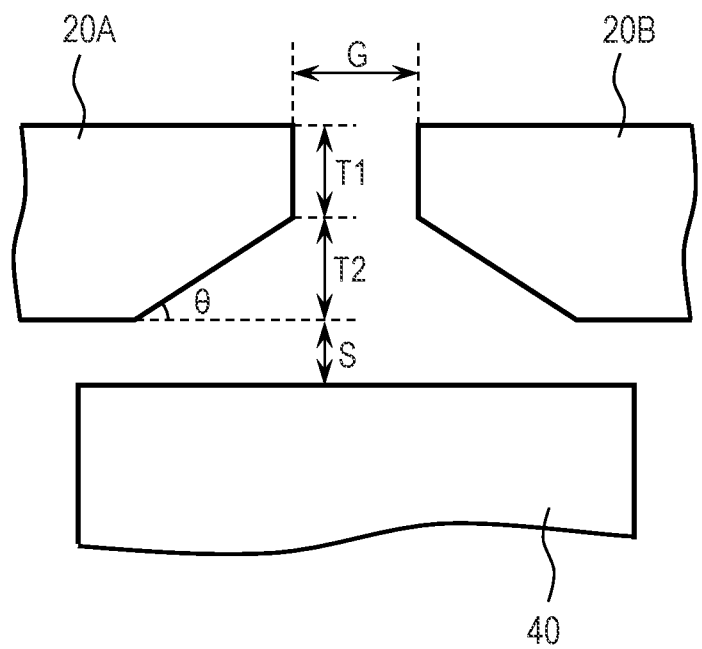
FIG. 4 is an enlarged schematic cross-sectional view illustrating a structure in the vicinity of an ejection port of the ion gun according to the first embodiment of the present invention.

Next, a specific shape of a portion where the magnetic pole plates 20A and 20B face the anode 40 will be described with reference to FIG. 4. FIG. 4 is a cross-sectional view conceptually illustrating a shape of a portion where the magnetic pole plates 20A and 20B face the anode 40.

The characteristic of the ion beam ejected from the ejection port 22 greatly changes depending on the shape of the tips of the magnetic pole plates 20A and 20B, the positional relationship between the magnetic pole plates 20A and 20B and the anode 40, and the like. Therefore, the shapes of the tips of the magnetic pole plates 20A and 20B, the positional relationship between the magnetic pole plates 20A and 20B and the anode 40, and the like are appropriately set in accordance with the required characteristics of the ion beam, but are typically set in a relationship as illustrated in FIG. 4, for example.

For example, as illustrated in FIG. 4, the tips of the magnetic pole plates 20A and 20B may be formed in a tapered shape with chamfered corner portions on the side facing the anode 40. When the width of the ejection port 22 is G, the thickness of the thinnest portion of the magnetic pole plates 20A and 20B is T1, the thickness of the tapered portion is T2, and the gap between the magnetic pole plates 20A and 20B and the anode 40 is S, all of them can be set to a size of about several millimeters. The taper angle θ may be set to about 45 degrees. The shapes of the tips of the magnetic pole plates 20A and 20B and the sizes of the respective portions are merely examples, and are not particularly limited. Depending on the ion gun, corner portions of the magnetic pole plates 20A and 20B on the side opposite to the anode 40 may be chamfered.

Figure 5A:
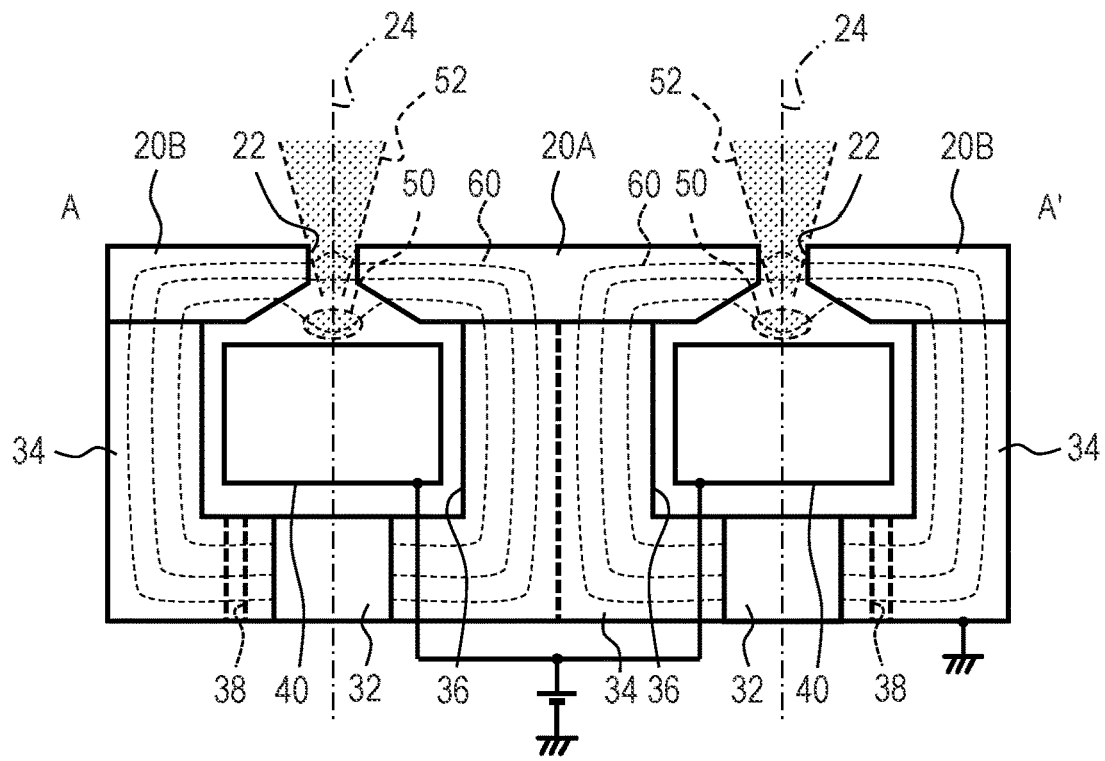
FIG. 5A is a diagram illustrating the operation of the ion gun according to the first embodiment of the present invention (Part 1).
Figure 5B:
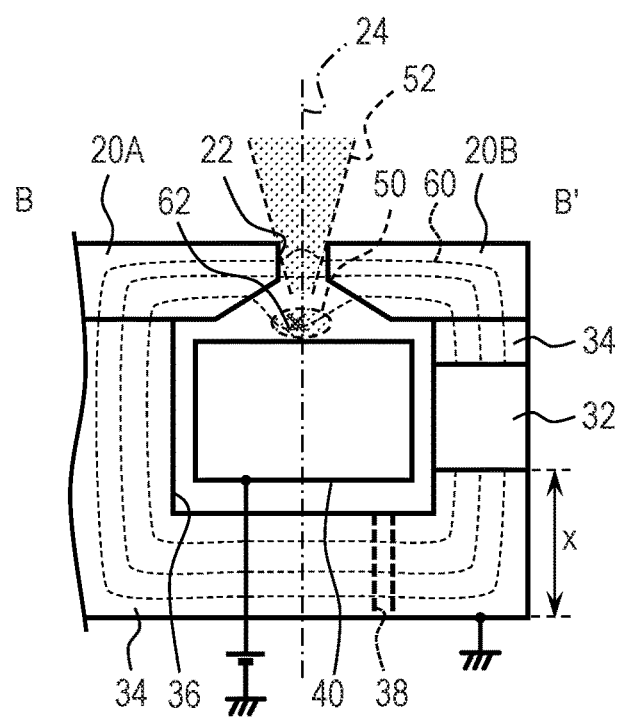
FIG. 5B is a diagram illustrating the operation of the ion gun according to the first embodiment of the present invention (Part 2).

Next, the operation of the ion gun according to the present embodiment will be described with reference to FIGS. 5A and 5B. FIGS. 5A and 5B illustrate the operation of the ion gun according to the present embodiment. FIG. 5A corresponds to a cross-sectional view taken along line A-A' of FIG. 2, and FIG. 5B corresponds to a cross-sectional view taken along line B-B' of FIG. 2. It is assumed that the cross-section illustrated in FIGS. 5A and 5B is a surface which appears when the ion gun 10 is cut in a direction in which the width of the ejection port 22 becomes minimum.

First, a discharge gas such as argon (Ar) is supplied to the recessed portion 36 through the gas inlet port 38 to adjust the pressure inside the ion gun 10 to about 0.1 Pa. When the pressure of the environment in use (for example, the pressure in the chamber of the vacuum processing apparatus in which the ion gun 10 is installed) is already about 0.1 Pa and discharge is possible in that state, the gas supply operation may be omitted.

Next, the magnetic pole plates 20A and 20B as cathodes and the yoke 34 are set to a ground potential (0 V), and a voltage of, for example, about 1000 V to 4000 V is applied to the anode 40 from a power source (not illustrated). Thus, an electric field is generated between the anode 40 and the magnetic pole plates 20A and 20B, and the gas introduced into the ion gun 10 is excited, dissociated, and ionized by the electric field, thereby generating plasma 50.

On the other hand, the magnetic flux emitted from the N pole of the magnet 32 (magnetic field line 60) passes through the yoke 34 and the magnetic pole plate 20B, and is emitted from the tip of the magnetic pole plate 20B. The magnetic field lines 60 emitted from the tips of the magnetic pole plates 20B spread by repulsive force and are then sucked into the magnetic pole plates 20A. As a result, in the gap space between the magnetic pole plates 20A and the magnetic pole plates 20B, as illustrated in FIG. 5A and FIG. 5B, the magnetic field lines 60 are vertically convex. The magnetic field space having such a shape is called a mirror magnetic field. The mirror magnetic field acts to confine charged particles therein.

Figure 6:
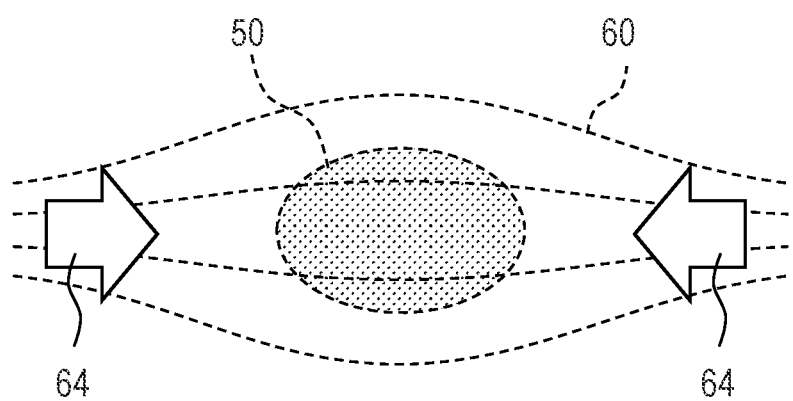
FIG. 6 is a schematic diagram illustrating a magnetic mirror force generated by a mirror magnetic field.

FIG. 6 is a schematic diagram illustrating a magnetic mirror force generated by a mirror magnetic field. As illustrated in FIG. 6, when the magnetic field lines 60 have dense portions and sparse portions, the charged particles in the mirror magnetic field receive the magnetic mirror force 64 in a direction from the dense portions to the sparse portions of the magnetic field lines 60. Thereby, the charged particles are confined in the mirror magnetic field. In addition, when the plasma 50 is generated in the mirror magnetic field, the density of the plasma 50 is higher than that when the magnetic field is not present.

Electrons in the plasma 50 are drawn into the anode 40 by an electric field between the magnetic pole plates 20A and 20B and the anode 40. Positive ions in the plasma 50 are accelerated by a potential difference between the magnetic pole plates 20A and 20B and the anode 40 to form an ion beam 52.

As described above, the ion gun 10 according to the present embodiment is characterized in that the magnet 32 is arranged outside the cross-sectional centerline 24 of the ejection port 22 in the curved portion 22b of the ejection port 22. The reason why the ion gun 10 of the present embodiment is configured in this manner will be described below while comparing with the ion gun of the reference example.

Figure 7A:
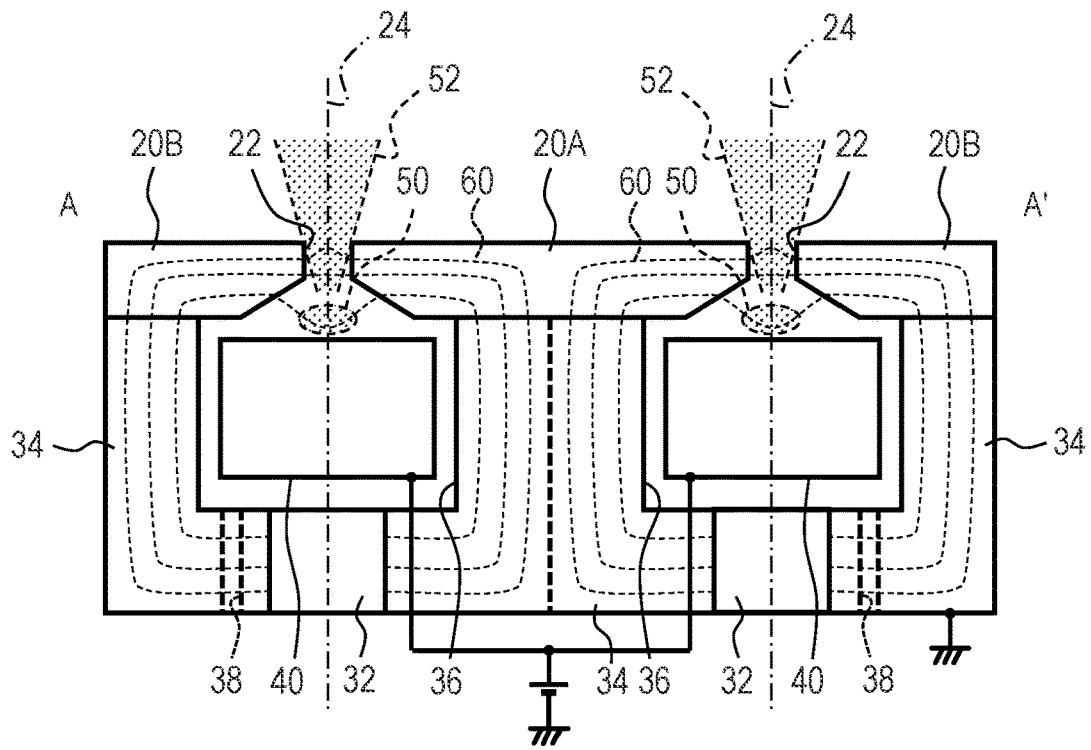
FIG. 7A is a diagram illustrating the structure and operation of the ion gun according to a reference example (Part 1).
Figure 7B:
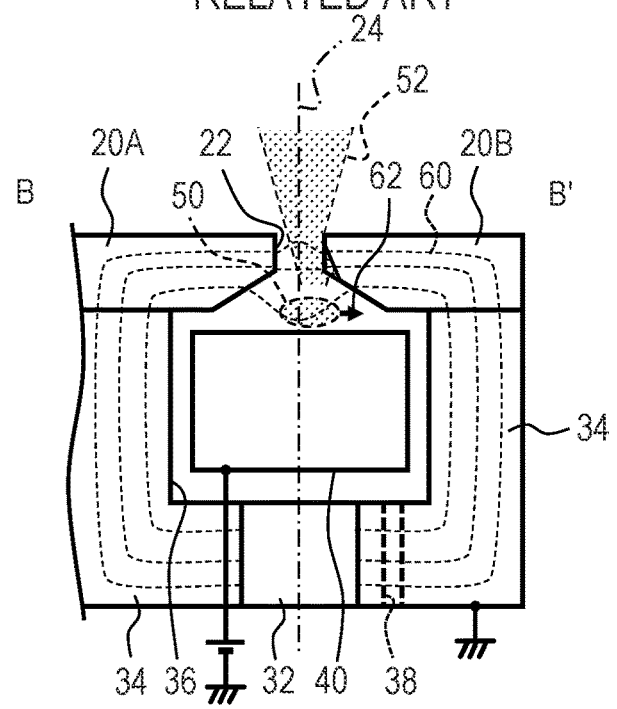
FIG. 7B is a diagram illustrating the structure and operation of the ion gun according to the reference example (Part 2).

FIGS. 7A and 7B are schematic cross-sectional views illustrating the structure and operation of the ion gun according to the reference example. FIG. 7A corresponds to a cross-sectional view taken along line A-A' of FIG. 1, and FIG. 7B corresponds to a cross-sectional view taken along line B-B' of FIG. 1. The ion gun according to the reference example illustrated in FIGS. 7A and 7B is similar to the ion gun 10 according to the present embodiment except that the arrangement of the magnets 32 is different. That is, in the ion gun according to the reference example, the magnet 32 is arranged at a position opposed to the ejection port 22 with the anode 40 interposed therebetween. That is, the magnet 32 is positioned on the cross-sectional centerline 24 of the ejection port 22 in both the linear portion 22a and the curved portion 22b of the ejection port 22.

In a general ion gun, a magnetic field is designed so that the magnetic field is symmetrical with respect to the cross-sectional centerline 24 of the ejection port 22. By designing the magnetic field in this way, the center of the generated plasma 50 is positioned on the cross-sectional centerline 24 of the ejection port 22, so that collision of the ion beam 52 with the magnetic pole plates 20A and 20B can be minimized, and the ion beam 52 can be ejected efficiently. For this purpose, the magnet 32 is often arranged at a position opposed to the ejection port 22 with the anode 40 interposed therebetween, for example, as in the ion gun according to the reference example illustrated in FIGS. 7A and 7B.

However, when the magnetic field is designed in the curved portion 22b of the ejection port 22 in the same manner as the linear portion 22a, as illustrated in FIG. 7B, the center of the generated plasma 50 is shifted outside the cross-sectional centerline 24 of the ejection port 22, and the ion beam 52 which collides with the magnetic pole plate 20B increases. Thus, the ion beam 52 cannot be efficiently ejected from the ejection port 22.

Further, the magnetic pole plates 20A and 20B are eroded over time by the sputtering action of the ion beam 52 which collides with the magnetic pole plates 20A and 20B, and the discharge stability gradually decreases, and finally the discharge cannot be maintained. Therefore, the magnetic pole plates 20A and 20B need to be periodically replaced, but when the collision ion beam 52 increases, the amount by which the magnetic pole plates 20A and 20B are eroded increases, and the maintenance cycle shortens. Further, since particles generated by sputtering the magnetic pole plates 20A and 20B cause contamination of the processing apparatus, it is desirable that the amount of ion beams 52 which collide with the magnetic pole plates 20A and 20B be as small as possible.

Figure 8:
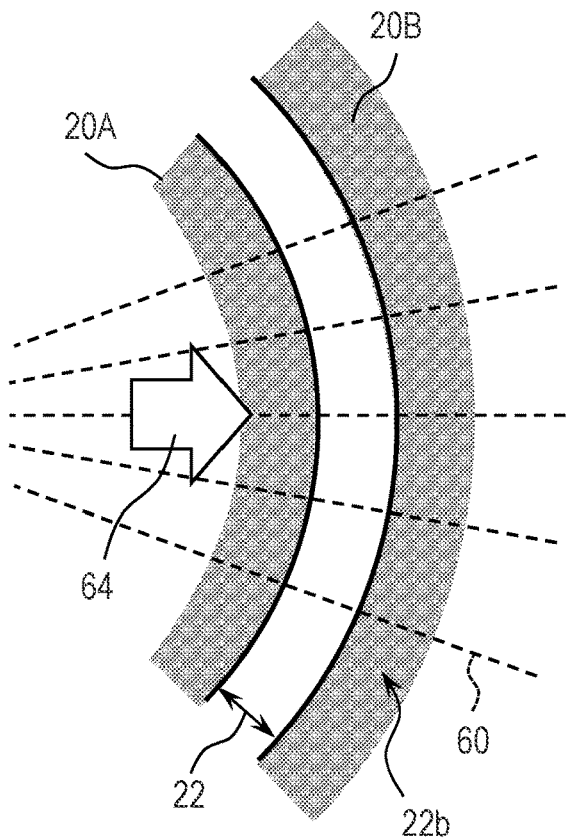
FIG. 8 is a schematic diagram illustrating the magnetic mirror force generated in a curved portion of the ejection port.
Figure 9:
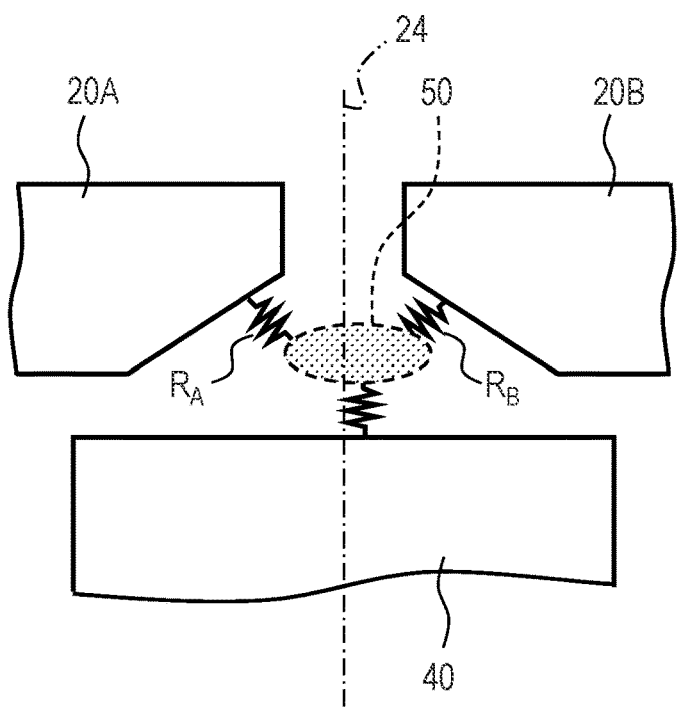
FIG. 9 is a schematic diagram illustrating an electrical relationship among plasma, an anode, and a magnetic pole plate in the curved portion of the ejection port.

The reason why the center of the plasma 50 is shifted outside from the center of the cross-section of the ejection port 22 in the curved portion 22b of the ejection port 22 will be described with reference to FIGS. 8 and 9. FIG. 8 is a schematic diagram illustrating a magnetic mirror force generated in the curved portion 22b of the ejection port 22. FIG. 9 is a diagram illustrating the electrical relationship between the plasma 50 and the anode 40 and the magnetic pole plates 20A and 20B in the curved portion 22b of the ejection port 22.

As illustrated in FIG. 8, the interval between the magnetic field lines 60 of the curved portion 22b in the plane parallel to the magnetic pole plates 20A and 20B (XY plane) gradually spreads from the magnetic pole plate 20A toward the magnetic pole plate 20B. That is, the magnetic field lines 60 are dense on the magnetic pole plate 20A side (inside of the ejection port 22) and sparse on the magnetic pole plate 20B side (outside of the ejection port 22). As a result, as illustrated in FIG. 7B, the plasma 50 receives the magnetic mirror force 64 directed outside by the magnetic mirror effect, and shifts toward the magnetic pole plate 20B side (outside the cross-sectional centerline 24 of the ejection port 22).

When the areas where the magnetic pole plates 20A and 20B are in contact with the plasma 50 in the curved portion 22b are compared, the area where the magnetic pole plate 20B is in contact with the plasma 50 (electrode area) is larger than the area where the magnetic pole plate 20A is in contact with the plasma 50 (electrode area). Therefore, when the resistance $R_A$ between the plasma 50 and the magnetic pole plate 20A and the resistance $R_B$ between the plasma 50 and the magnetic pole plate 20B are compared, the resistance between the magnetic pole plate 20B having a larger electrode area than the magnetic pole plate 20A and the plasma 50 becomes smaller ($R_A > R_B$). That is, the magnetic pole plate 20B acts more strongly as a cathode than the magnetic pole plate 20A. As a result, a larger amount of current flows toward the magnetic pole plate 20B, and the plasma 50 is generated more on the magnetic pole plate 20B side.

Due to these two actions, in the curved portion 22b of the ejection port 22, the center of the plasma 50 is shifted outside from the cross-sectional centerline 24 of the ejection port 22.

From this point of view, in the ion gun 10 according to the present embodiment, the magnetic field is designed such that the bottom 62 of the magnetic field line 60 is positioned closer to the magnetic pole plate 20A than the cross-sectional centerline 24 of the ejection port 22 in the curved portion 22b of the ejection port 22 (see FIG. 5B). That is, the center position of the ion beam 52 ejected from the ejection port 22 is adjusted so that the position of the bottom 62 of the magnetic field line 60 formed between the magnetic pole plate 20A and the magnetic pole plate 20B of the curved portion 22b is shifted inside from the cross-sectional centerline 24 of the ejection port 22. In the present specification, the bottom 62 of the magnetic field line 60 means a point on the magnetic field line 60 in the space between the magnetic pole plates 20A and 20B and the anode 40, where the tangential direction to the magnetic field line 60 is parallel to the surface of the anode 40 facing the ejection port 22.

Figure 10:
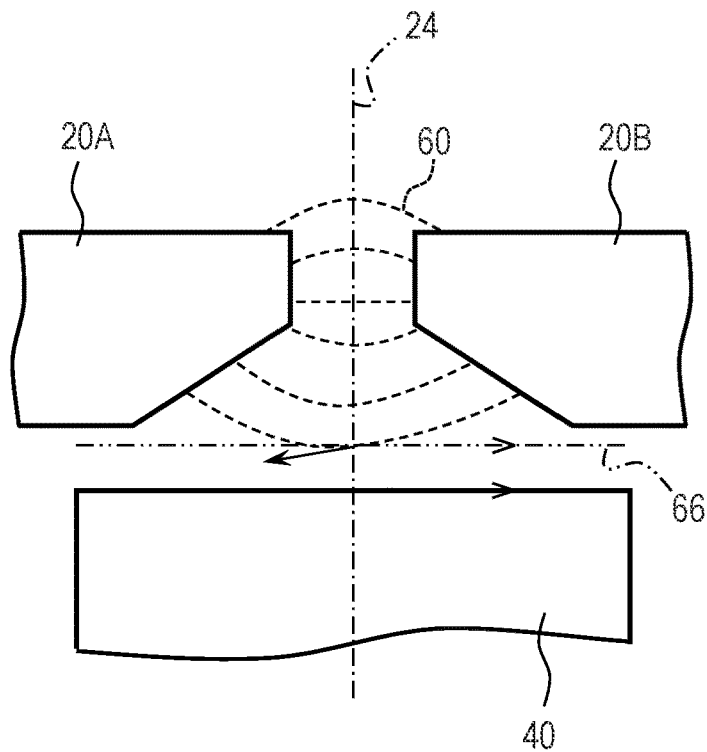
FIG. 10 is a schematic diagram illustrating a direction of a magnetic field vector on a cross-sectional center line of an ejection port.

From another point of view, in the space between the magnetic pole plates 20A, 20B and the anode 40 of the curved portion 22b, the direction of the magnetic field line 60 (magnetic field vector) from the magnetic pole plate 20B toward the magnetic pole plate 20A is inclined toward the anode 40 with respect to the plane 66 orthogonal to the cross-sectional centerline 24 at the point where the cross-sectional centerline 24 of the ejection port 22 and the magnetic field line 60 intersect with each other (see FIG. 10). That is, in the curved portion 22b, the center position of the ion beam 52 ejected from the ejection port 22 is adjusted such that the magnetic field vector at the point where the magnetic field line 60 and the cross-sectional centerline 24 of the ejection port 22 intersect is inclined toward the anode 40 with respect to the plane orthogonal to the cross-sectional centerline 24.

Figure 11:
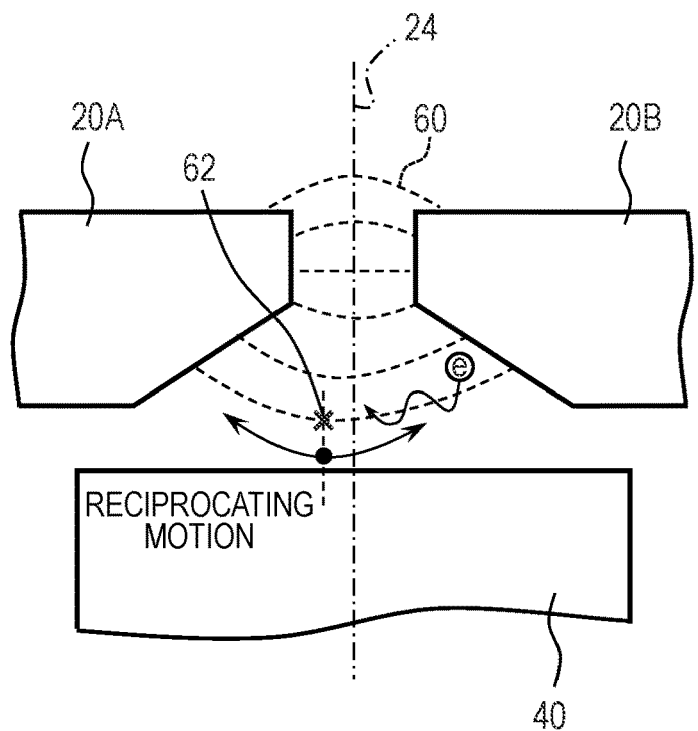
FIG. 11 is a schematic diagram illustrating movement of electrons in a space between the magnetic pole plate and the anode.

FIG. 11 is a schematic diagram illustrating movement of electrons in a space between the magnetic pole plates 20A and 20B and the anode 40. In the plasma, electrons and ions are continuously generated by ionization. The generated electrons e are attracted to the anode 40 by the potential difference between the magnetic pole plates 20A and 20B and the anode 40, but are also subjected to the force of the magnetic field (Lorentz force), and thus move along the magnetic field line 60 so as to be entangled with the magnetic field line 60, and reciprocate around the bottom 62. The reciprocally moving electrons e gradually lose energy due to collision with the gas and are finally collected by the anode 40. The kinetic energy of the electrons e is highest during the reciprocating motion when the electrons e are positioned at the bottom 62 of the magnetic field line 60. Therefore, the frequency of occurrence of ionization, that is, the density of the plasma 50 is the highest in the vicinity of the bottom 62 of the magnetic field line 60. Therefore, if the magnetic field is designed so that the position of the bottom 62 of the magnetic field line 60 is shifted from the cross-sectional centerline 24 of the ejection port 22, the centers of the plasma 50 and the ion beam 52 can also be shifted from the cross-sectional centerline 24 of the ejection port 22.

Therefore, by shifting the position of the bottom 62 of the magnetic field line 60 toward the inside of the cross-sectional centerline 24 of the ejection port 22 so as to cancel the movement of the plasma 50 toward the outside due to the magnetic mirror effect, the center of the plasma 50 can be shifted to the vicinity of the cross-sectional centerline 24 of the ejection port 22. Thus, the collision of the ion beam 52 with the magnetic pole plates 20A and 20B can be minimized in the curved portion 22b of the ejection port 22 as well as in the linear portion 22a, and the ion beam 52 can be efficiently ejected.

Since the magnetic field lines 60 exist in an unlimited number, the bottoms 62 of the magnetic field lines 60 also exist in an unlimited number. What is important in the present invention is the position of the bottom 62 of the magnetic field lines 60 at the height at which the plasma 50 is generated, as can be seen from the mechanism. In many cases, plasma 50 is generated near a height of about 1 mm from the surface of anode 40. Thus, in one example, the position of the bottom 62 of the magnetic field line 60 can be defined as the position of the bottom 62 of the magnetic field line 60 at a height of 1 mm from the surface of the anode 40.

Next, the amount by which the position of the bottom 62 of the magnetic field line 60 is shifted inside from the cross-sectional centerline 24 of the ejection port 22 will be described. The shift amount of the bottom 62 was examined by simulation using ELF/MAGIC, which is general-purpose magnetic field analysis software, and PEGASUS, which is general-purpose plasma analysis software. As the conditions of the simulation, the gas for plasma generation was Ar, the pressure in the chamber was 0.07 Pa, and the voltage applied to the anode 40 was 3000 V.

Figure 12:
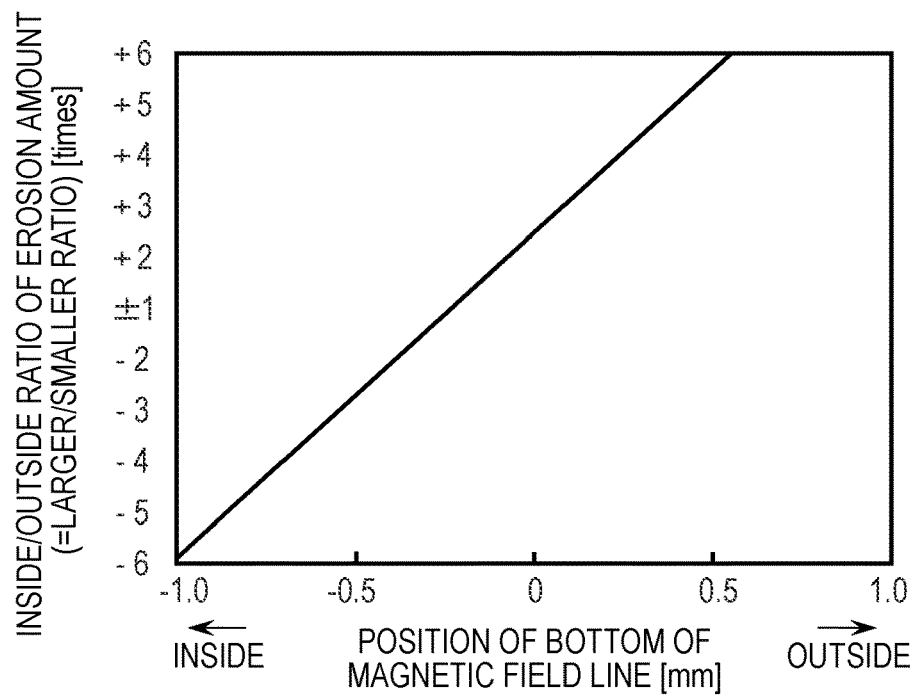
FIG. 12 is a graph illustrating a result of simulation of the amount of an erosion of the magnetic pole plate when the position of the bottom of the magnetic field line is changed.

FIG. 12 is a graph illustrating a result of simulation of the amount of erosion of the magnetic pole plates 20A and 20B when the position of the bottom 62 of the magnetic field line 60 is changed. The vertical axis represents the ratio of the amount of erosion of the magnetic pole plate 20A to the amount of erosion of the magnetic pole plate 20B (inside/outside ratio of erosion). The vertical axis represents a value obtained by dividing the larger value of the erosion amount of the magnetic pole plate 20A and the erosion amount of the magnetic pole plate 20B by the smaller value. The vertical axis represents a positive value when the erosion amount of the magnetic pole plate 20B is larger than the erosion amount of the magnetic pole plate 20A, and represents a negative value when the erosion amount of the magnetic pole plate 20A is larger than the erosion amount of the magnetic pole plate 20B. The horizontal axis represents the distance (the position of the bottom of the magnetic field line) from the center line of the cross-section of the ejection port 22 to the bottom 62 of the magnetic field line 60. The horizontal axis indicates the shift amount when the position of the bottom 62 is shifted outside with respect to the cross-sectional centerline 24 of the ejection port 22 as a positive value and indicates the shift amount when the position of the bottom 62 is shifted inside with respect to the cross-sectional centerline 24 of the ejection port 22 as a negative value.

As illustrated in FIG. 12, the inside/outside ratio of the erosion of the magnetic pole plates 20A and 20B is approximately proportional to the position of the bottom 62 of the magnetic field line 60. The inside/outside ratio of the erosion increases in the positive direction as the position of the bottom 62 of the magnetic field line 60 shifts in the outside direction, and increases in the negative direction as the position of the bottom 62 of the magnetic field line 60 shifts in the inside direction.

For example, when the bottom 62 of the magnetic field line 60 in the curved portion 22b of the ejection port 22 is positioned on the cross-sectional centerline 24 of the ejection port 22 (shift amount=0 mm), the centers of the plasma 50 and the ion beam 52 shift outside from the cross-sectional centerline 24 of the ejection port 22 as described above. In this case, the amount of the erosion of the magnetic pole plate 20B was about 2.1 times the amount of the erosion of the magnetic pole plate 20A.

In order to evenly shift the amount of the erosion of the magnetic pole plates 20A and 20B, that is, in order to shift the centers of the plasma 50 and the ion beam 52 to the vicinity of the cross-sectional centerline 24 of the ejection port 22, the bottom 62 of the magnetic field line 60 may be shifted toward the inside of the cross-sectional centerline 24 of the ejection port 22. In the example of FIG. 12, it has been found that the position of the bottom 62 of the magnetic field line 60 is preferably shifted toward the inside direction by about 0.1 mm to 0.4 mm from the center of the cross-section of the ejection port 22, and it is optimal to shift toward the inside direction by 0.25 mm from the center of the cross-section of the ejection port 22.

At positions where the inside/outside ratios of the erosion are even, the absolute amount of the erosion of the magnetic pole plates 20A and 20B tends to be small. In the study by the inventors, by setting the amount of shift of the bottom 62 to 0.1 mm to 0.4 mm, the amount of the erosion of the magnetic pole plates 20A and 20B can be reduced by about 20% at maximum as compared with the case where the amount of shift of the bottom 62 is set to 0 mm. This means that the heat generation of the magnetic pole plates 20A and 20B, the contamination of the processed object, the beam loss, and the like can be reduced by about 20% at maximum.

Further, in the study by the present inventors, by setting the shift amount of the bottom 62 to 0.1 mm to 0.4 mm, the peak value of the erosion rate can be reduced from about 1/1.3 to about 1/1.8 of that in the case where the shift amount of the bottom 62 is set to 0 mm. This corresponds to an increase in the life of the component and the maintenance cycle of about 1.3 to 1.8 times.

Note that an appropriate shift amount of the position of the bottom 62 of the magnetic field line 60 changes depending on the structure of the ion gun 10, the discharge condition, and the like. For example, when the size of the ion gun 10 or the curvature of the curved portion 22b of the ejection port 22 is increased, the optimal shift amount is considered to be larger than the above-described value. The shift amount of the position of the bottom 62 of the magnetic field line 60 is preferably set as appropriate in accordance with the structure of the ion gun 10, the discharge condition, and the like.

Although the method for shifting the position of the bottom 62 of the magnetic field line 60 in the curved portion 22b of the ejection port 22 is not particularly limited, an example is a method of changing the position of the magnet 32 as described in the present embodiment. Shifting the position of the bottom 62 of the magnetic field line 60 is to disrupt the symmetry of the magnetic field with respect to the cross-sectional centerline 24 of the ejection port 22, and it can be said that moving the location of the magnet 32 is the most direct method.

Figure 13:
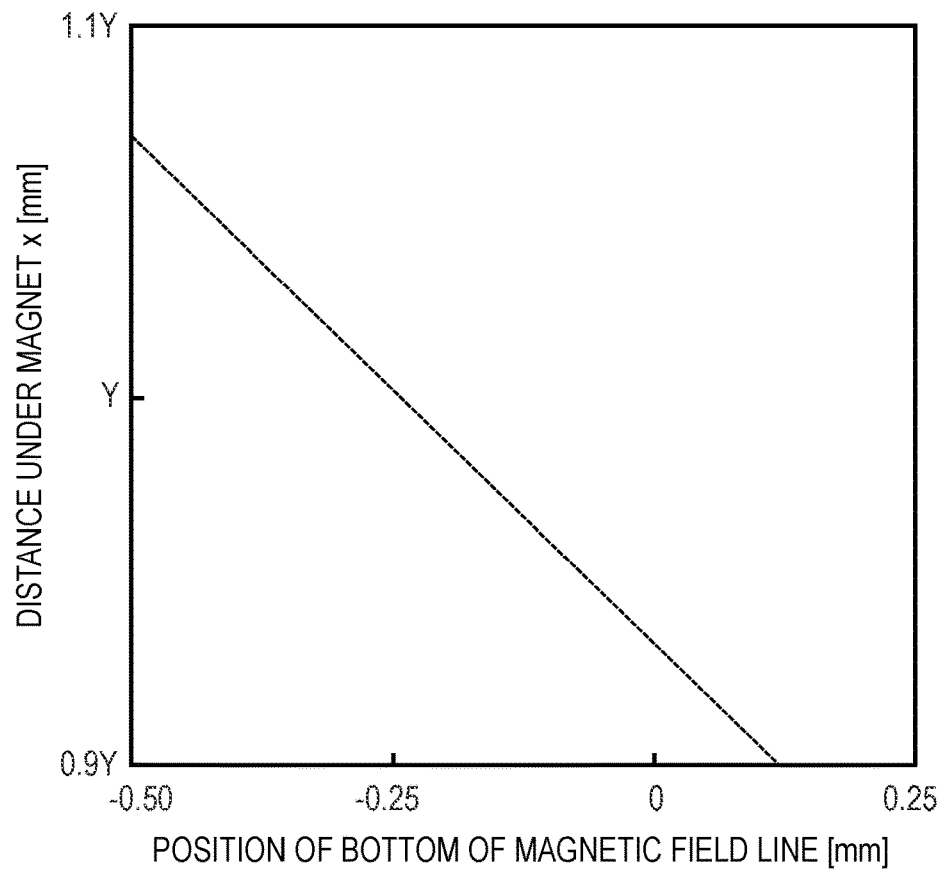
FIG. 13 is a graph illustrating a simulation result of a relationship between a distance under a magnet and a bottom position of a magnetic field line.

FIG. 13 is a graph illustrating a simulation result of a relationship between a distance under a magnet and a bottom position of a magnetic field line. The "distance under magnet" on the vertical axis represents the distance x (see FIG. 5B) from the lower surface of the structure 30 to the lower surface of the magnet 32. In the "position of bottom of magnetic field line" on the horizontal axis, when the bottom 62 is positioned on the cross-sectional centerline 24 of the ejection port 22 is 0, a position inside the cross-sectional centerline 24 is represented by a negative sign, and a position outside the cross-sectional centerline 24 is represented by a positive sign. In the simulation, the distance x under the magnet 32 is changed without changing the size of the magnet 32.

As illustrated in FIG. 13, the distance x under the magnet and the position of the bottom 62 of the magnetic field line 60 are approximately proportional to each other. By changing the distance x under the magnet, the inside/outside balance of the magnetic field in the vicinity of the magnetic pole changes, and the position of the bottom 62 of the magnetic field line 60 changes. By increasing the distance x under the magnet, the position of the bottom 62 of the magnetic field line 60 can be shifted toward the inside direction of the ejection port 22. According to the simulation result, by setting the distance x under the magnet to Y, the position of the bottom 62 of the magnetic field line 60 can be shifted inside by 0.25 mm. Y may be set to a size of several tens of mm.

Figure 14:
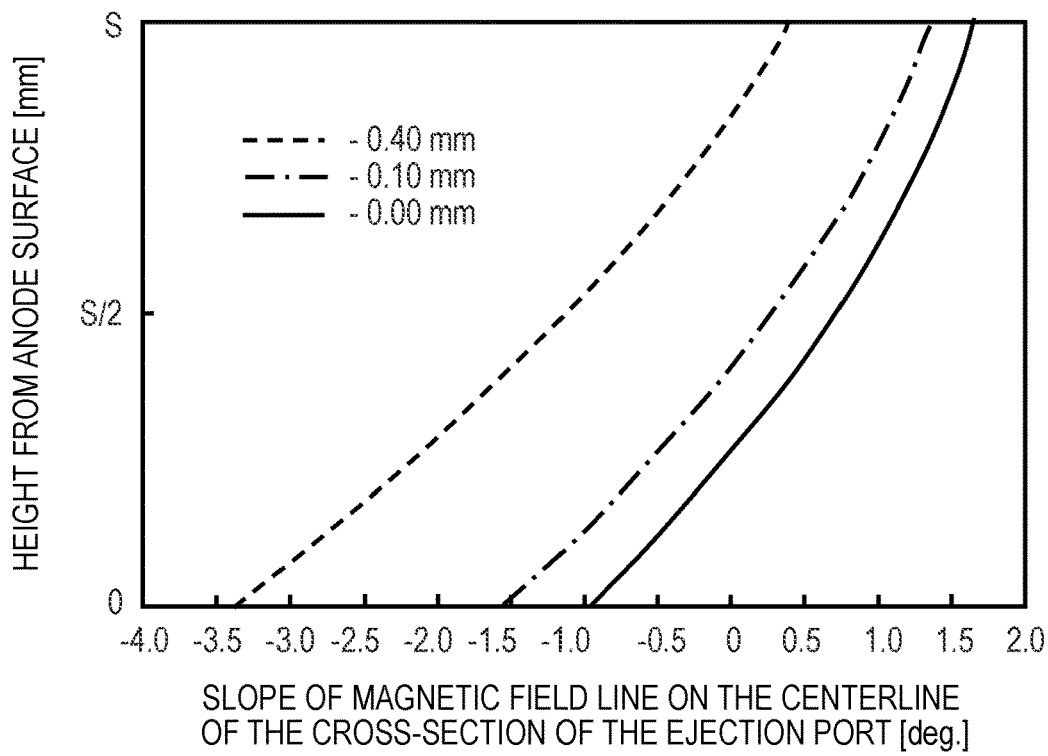
FIG. 14 is a graph illustrating the relationship between a distance from the anode on the centerline of the cross-section of the ejection port and the slope angle of the magnetic field line acquired by simulation.

FIG. 14 is a graph illustrating the relationship between the distance from the anode 40 on the cross-sectional centerline 24 of the ejection port 22 and the inclination angle of the magnetic field lines 60. FIG. 14 illustrates simulation results when the positions of the bottoms 62 of the magnetic field lines 60 are set to −0.1 mm, −0.4 mm, and 0 mm, respectively. The position of the bottom 62 of the magnetic field line 60 is indicated by a negative sign at a position inside the cross-sectional centerline 24 of the ejection port 22 and a positive sign at a position outside the cross-sectional centerline 24 of the ejection port 22. The inclination angle of the magnetic field lines 60 is 0 degree when the magnetic field lines 60 are parallel to the plane 66 (FIG. 10) orthogonal to the cross-sectional centerline 24 of the ejection port 22, is represented by a negative sign when the magnetic field lines 60 are inclined toward the anode 40, and is represented by a positive sign when the magnetic field lines 60 are inclined toward the magnetic pole plates 20A and 20B.

As illustrated in FIG. 14, as the magnetic field line 60 is closer to the anode 40, the inclination angle of the magnetic field line 60 toward the anode 40 at a point intersecting the cross-sectional centerline 24 of the ejection port 22 becomes larger. Further, as the shift amount of the position of the bottom 62 of the magnetic field line 60 increases in the inside direction, the inclination angle toward the anode 40 at the point intersecting the cross-sectional centerline 24 of the ejection port 22 increases. According to the simulation results, it was found that the inclination angle of the magnetic field lines 60 in the range of the shift amount −0.1 mm to −0.4 mm in which improvement was seen in the absolute amount of the erosion of the magnetic pole plates 20A and 20B and the peak value of the erosion rate was in the range of 1.5 degrees to −3.5 degrees.

That is, in the curved portion 22b, it is desirable that the magnetic field vector at the point where the magnetic field line 60 and the cross-sectional centerline 24 of the ejection port 22 intersect be inclined at a first angle in the range of 0 degrees to 1.5 degrees toward the magnetic pole plates 20A and 20B and in the range of 0 degrees to 3.5 degrees toward the anode 40 with respect to the plane 66 orthogonal to the cross-sectional centerline 24. Further, in the linear portion 22a, it is desirable that the magnetic field vector at the point at which the magnetic field line 60 and the cross-sectional centerline 24 of the ejection port 22 intersect each other forms a second angle smaller than the first angle with respect to the plane 66 orthogonal to the cross-sectional centerline 24. The optimal value of the second angle is 0 degrees where the magnetic field vector is parallel to the plane 66.

The method for shifting the position of the bottom 62 of the magnetic field line 60 by disrupting the symmetry of the magnetic field is not limited to the method of moving the position of the magnet 32. Other methods include, for example, a method for controlling the applied current when an electromagnet is used as the magnet 32.

Second Embodiment

Figure 15:
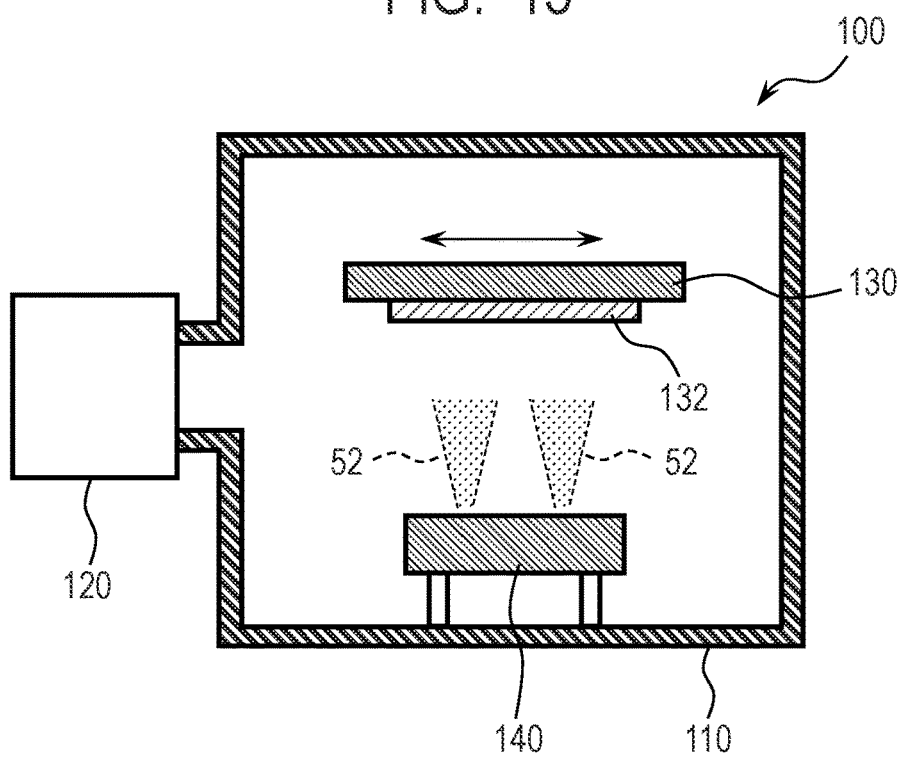
FIG. 15 is a schematic diagram illustrating a vacuum processing apparatus according to a second embodiment of the present invention.

A vacuum processing apparatus according to a second embodiment of the present invention will be described with reference to FIG. 15. FIG. 15 is a schematic diagram of a vacuum processing apparatus according to the present embodiment. The same components as those of the ion gun according to the first embodiment are denoted by the same reference numerals, and the description thereof will be omitted or simplified.

In the present embodiment, as an example of an apparatus to which the ion gun 10 according to the first embodiment is applied, an ion beam etching apparatus which is one of vacuum processing apparatuses used for manufacturing a semiconductor device or the like will be described. The application example of the ion gun according to the first embodiment is not limited to the ion beam etching apparatus, and may be a film forming apparatus such as an ion beam sputtering apparatus. Further, the application example of the ion gun according to the first embodiment is not limited to the vacuum processing apparatus, but may be another apparatus including the ion gun.

As illustrated in FIG. 15, the vacuum processing apparatus 100 according to the present embodiment may include, as main components, a vacuum chamber 110, a vacuum pump 120, a holder 130 that holds a substrate 132 to be processed, and an ion gun 140. The vacuum pump 120 is connected to the vacuum chamber 110. The holder 130 and the ion gun 140 are installed in the vacuum chamber 110.

The vacuum chamber 110 is a processing chamber in which the inside can be maintained in a vacuum state, and various processes such as etching, surface modification, and surface cleaning can be performed inside the vacuum chamber 110.

The vacuum pump 120 is an exhausting device for exhausting gas in the vacuum chamber 110 and bringing the inside of the vacuum chamber 110 into a vacuum state. By exhausting the gas in the vacuum chamber 110 by the vacuum pump 120, the inside of the vacuum chamber can be brought into a high vacuum state of about $10^{-3}$ to $10^{-6}$ Pa.

The holder 130 is a member for holding a processed object (substrate 132) made of, for example, Si, Ga, carbon, or the like. The holder 130 may include a swing mechanism. Since the holder 130 includes the swing mechanism, the substrate 132 can be subjected to processing with high in-plane uniformity. The holder 130 may further have another function, for example, a heating function for heating the substrate 132.

The ion gun 140 is the ion gun described in the first embodiment, and is arranged at a position opposed to the substrate 132 held by the holder 130. The ion gun 140 irradiates the positive ion beam 52 toward the substrate 132. The ion beam 52 emitted from the ion gun 140 collides with the substrate 132 with high kinetic energy. Thus, the surface of the substrate 132 can be subjected to a predetermined process such as etching.

By configuring the vacuum processing apparatus 100 using the ion gun 10 according to the first embodiment, it is possible to irradiate the substrate 132 with the ion beam 52 with high uniformity, thereby improving the processing quality. In addition, since collision of the ion beam 52 with the magnetic pole plates 20A and 20B can be reduced, the maintenance cycle can be extended. Thus, the production cost can be improved, and the processing capability of the substrate 132 can be improved. In addition, contamination of the inside of the vacuum chamber 110 and the substrate 132 due to particles generated by sputtering the magnetic pole plates 20A and 20B by the ion beam 52 can be suppressed.

Modified Embodiments

The present invention is not limited to the embodiments described above, and various modifications are possible.

For example, an example in which a configuration of a part of any embodiment is added to another embodiment or an example in which a configuration of a part of another embodiment is substituted is also an embodiment of the present invention. In addition, a known technique or a known technique in the technical field can be appropriately applied to a specific description or a portion not illustrated in the embodiments.

Further, in the above embodiment, although the magnet 32 is arranged on the cross-sectional centerline 24 of the ejection port 22 in the linear portion 22a of the ejection port 22, it is not necessarily required to be arranged on the cross-sectional centerline 24 if the magnetic field is symmetrical with respect to the cross-sectional centerline 24 of the ejection port 22.

Although argon gas is exemplified as the discharge gas in the above embodiments, the discharge gas is not limited to a rare gas such as argon, and may be a reactive gas represented by oxygen gas or nitrogen gas. The discharge gas may be appropriately selected depending on the purpose of use of the ion gun 10 or the like.

According to the present invention, the ejection efficiency and uniformity of the ion beam can be improved. In addition, it is possible to suppress collision of the ion beam with the magnetic pole, and realize excellent effects such as reduction in temporal change, improvement in maintenance cycle, and reduction in running cost.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

What is claimed is:

1. An ion gun comprising:
   an anode;
   a cathode opposed to the anode and having a first portion and a second portion; and
   a magnet configured to form a magnetic field space between the first portion and the second portion,
   wherein an annular gap including a linear portion and a curved portion is provided between the first portion and the second portion of the cathode, and
   wherein the magnet is configured to form, between the first portion and the second portion in the curved portion, a magnetic field line having a bottom inside a cross-sectional centerline of the gap.

2. The ion gun according to claim 1, wherein the magnet is configured to form, between the first portion and the second portion in the linear portion, a magnetic field line in which a position of a bottom with respect to the cross-sectional centerline of the gap is outside the curved portion.

3. The ion gun according to claim 2, wherein the magnet is configured to form, between the first portion and the second portion in the linear portion, a magnetic field line having a bottom on the cross-sectional centerline.

4. The ion gun according to claim 1, wherein a plasma is generated at a position of the bottom by an electric field applied between the anode and the cathode.

5. The ion gun according to claim 1, wherein the bottom is 1 mm high from a surface of the anode.

6. The ion gun according to claim 1, wherein a distance between the cross-sectional centerline and the bottom is in a range from 0.1 mm to 0.4 mm.

7. The ion gun according to claim 1, wherein in the curved portion, the magnet is arranged outside the cross-sectional centerline of the gap.

8. The ion gun according to claim 1, wherein in the linear portion, the magnet is arranged on the cross-sectional centerline of the gap.

9. The ion gun according to claim 1, wherein a thickness of a magnetic path between the second portion and the magnet is smaller than a thickness of a magnetic path between the first portion and the magnet.

10. The ion gun according to claim 1, wherein the gap is an ejection port for ejecting an ion beam.

11. The ion gun according to claim 1,
wherein the magnet constitutes a structure having an annular recessed portion for accommodating the anode and provided with a yoke for magnetically coupling the magnet with the first portion and the second portion, and
wherein the first portion and the second portion of the cathode are joined on a surface of the structure on which the annular recessed portion is provided such that the gap is located thereabove along the annular recessed portion.

12. A vacuum processing apparatus comprising:
a processing chamber capable of maintaining a vacuum state;
a holder arranged in the processing chamber and holding a processed object; and
the ion gun according to claim 1 arranged in the processing chamber and performing a predetermined treatment on the processed object by using an ion beam.

13. An ion gun comprising:
an anode;
a cathode opposed to the anode and having a first portion and a second portion; and
a magnet configured to form a magnetic field space between the first portion and the second portion,
wherein an annular gap including a linear portion and a curved portion is provided between the first portion and the second portion of the cathode,
wherein the first portion is arranged inside with respect to the gap and the second portion is arranged outside with respect to the gap,
wherein the magnet is configured to form, in a space between the first portion and the second portion and the anode, a magnetic field line in a direction from the second portion to the first portion, and
wherein in the curved portion, a magnetic field vector at a point where the magnetic field line and a cross-sectional centerline of the gap intersect with each other is inclined to a side of the first portion and the second portion, with respect to a plane orthogonal to the cross-sectional centerline, at a first angle smaller than 1.5 degrees and larger than 0 degrees to a side of the anode.

14. The ion gun according to claim 13, wherein in the linear portion, a magnetic field vector at a point where the magnetic field line intersects with the cross-sectional centerline of the gap forms a second angle smaller than the first angle on the anode side with respect to the plane orthogonal to the cross-sectional centerline.

15. The ion gun according to claim 13, wherein the first angle is an angle from 0 degrees to 3.5 degrees to the anode side.

16. The ion gun according to claim 13, wherein in the curved portion, a point at which a magnetic field vector of the magnetic field line is parallel to the plane orthogonal to the cross-sectional centerline is located closer to the second portion than the cross-sectional centerline, and is located at a distance in a range of 0.1 mm to 0.4 mm from the cross-sectional centerline.

17. The ion gun according to claim 13, wherein in the curved portion, the magnet is arranged outside the cross-sectional centerline of the gap.

18. The ion gun according to claim 13, wherein a thickness of a magnetic path between the second portion and the magnet is smaller than a thickness of a magnetic path between the first portion and the magnet.

19. An ion beam adjusting method adjusting an ion beam ejected from a gap in an ion gun including an anode, a cathode opposed to the anode and having a first portion and a second portion, and a magnet configured to form a magnetic field space between the first portion and the second portion, wherein the gap is an annular gap including a linear portion and a curved portion and provided between the first portion and the second portion of the cathode,
the method comprising:
adjusting a center position of an ion beam ejected from the gap by shifting a position of a bottom of a magnetic field line formed between the first portion and the second portion in the curved portion toward inside of a cross-sectional centerline of the gap.

20. An ion beam adjusting method adjusting an ion beam ejected from a gap in an ion gun including an anode, a cathode opposed to the anode and having a first portion and a second portion, and a magnet configured to form a magnetic field space between the first portion and the second portion, wherein the gap is an annular gap including a linear portion and a curved portion and provided between the first portion and the second portion of the cathode, wherein the first portion is arranged inside with respect to the gap and the second portion is arranged outside with respect to the gap, and wherein the magnet is configured to form, in a space between the first portion and the second portion and the anode, a magnetic field line in a direction from the second portion to the first portion,
the method comprising:
adjusting a center position of an ion beam ejected from the gap by inclining in the curved portion, a magnetic field vector at a point where the magnetic field line and a cross-sectional centerline of the gap intersect with each other toward the anode with respect to a plane orthogonal to the cross-sectional centerline.

* * * * *